INVENTOR.
JOSEPH GUARRACINI
BY
Samuel Cohen
ATTORNEY

May 2, 1967 J. GUARRACINI 3,316,618

METHOD OF MAKING CONNECTION TO STACKED PRINTED CIRCUIT BOARDS

Filed Dec. 9, 1963 3 Sheets-Sheet 2

INVENTOR
JOSEPH GUARRACINI
BY
ATTORNEY

INVENTOR.
JOSEPH GUARRACINI
BY Samuel Cohen
ATTORNEY

United States Patent Office 3,316,618

Patented May 2, 1967

3,316,618
METHOD OF MAKING CONNECTION TO STACKED PRINTED CIRCUIT BOARDS
Joseph Guarracini, Trenton, N.J., assignor to Radio Corporation of America, a corporation of Delaware
Filed Dec. 9, 1963, Ser. No. 328,913
2 Claims. (Cl. 29—155.5)

This invention relates to the interconnection of electrical circuits and, more particularly, to the interconnection of conductors printed on insulator substrates (such as "cards").

In the arrangement of the invention, electrical circuits which may include conductors, resistors and other elements, are printed, silk screened, stenciled or otherwise formed on a surface of a card. The card includes a tab, and a terminal on the tab, which may be formed at the same time as the circuits. The terminal connects to the circuit. The cards are placed one over another to form a stack of such cards in which the tabs on successive cards are staggered. A multiple socket connector, each socket containing a relatively low-melting-point conductor which may mate with a tab, is used to connect to the tabs. Connection between the connector and tabs is insured by melting the conductor in each socket and then permitting it to solidify.

The invention is discussed in greater detail below and is shown in the following drawings of which:

Figure 3A:
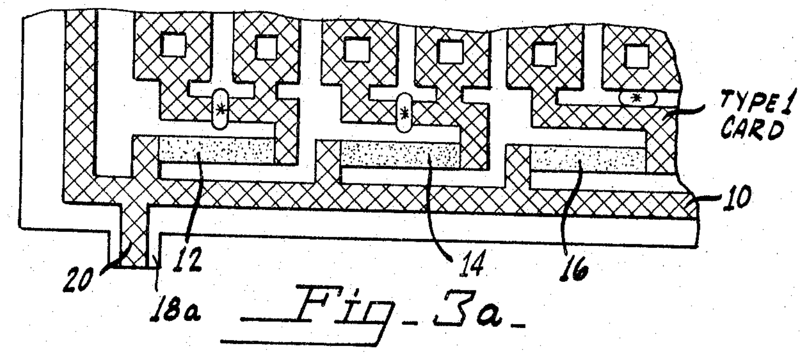
Figure 3B:
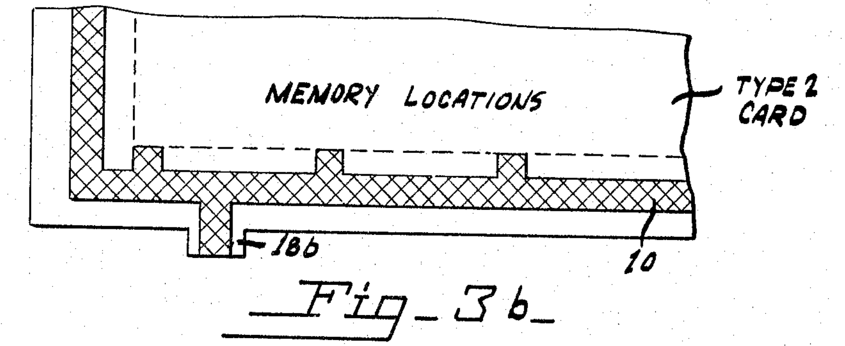
Figure 3C:
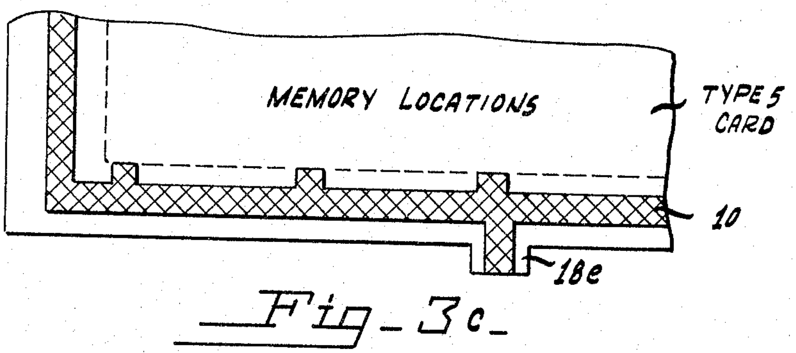
Figure 4:
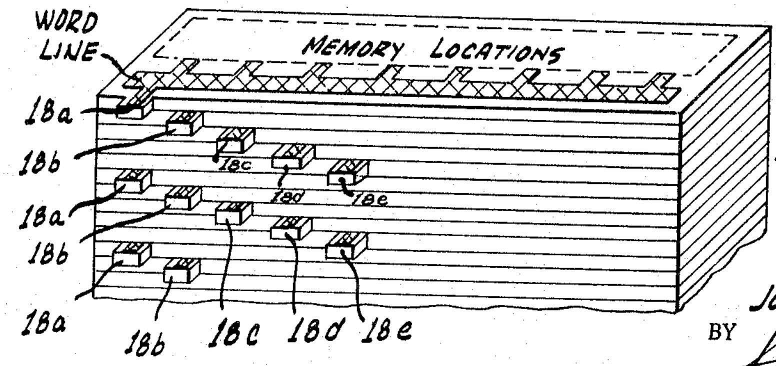
Figure 5:
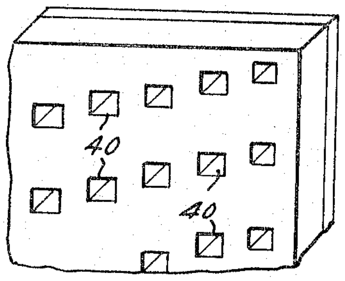
Figure 6:
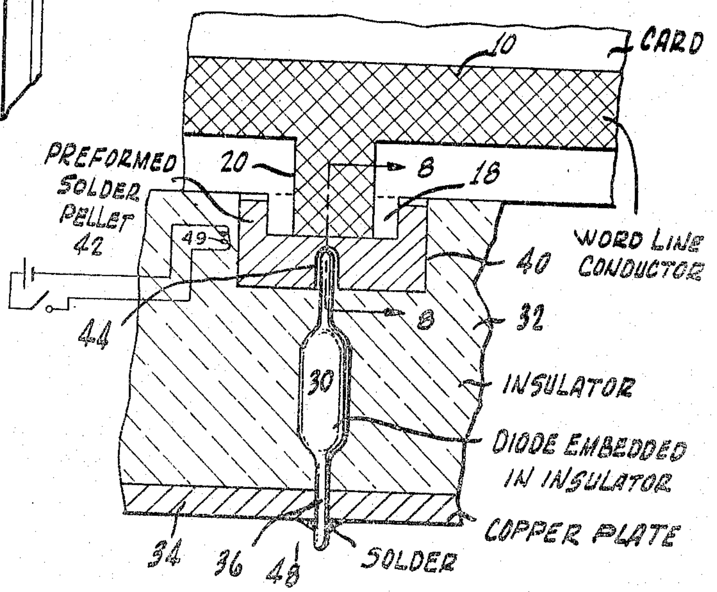
Figure 8:
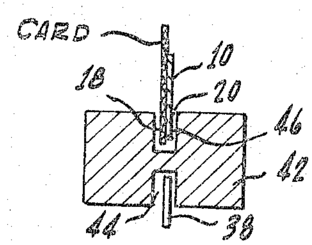
Figure 7:
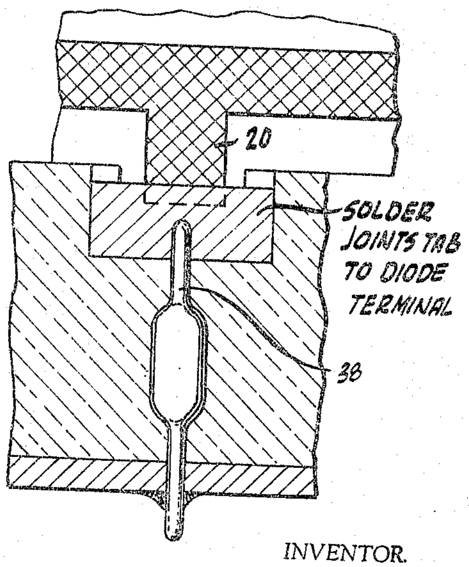

FIGS. 3*a*–3*c* are plan views of portions of a memory card according to the present invention;

FIG. 4 is a perspective view of a portion of a stack of memory cards such as shown in FIG. 3;

FIG. 5 is a perspective view of a portion of connector for the stack of FIG. 4;

FIGS. 6 and 7 are enlarged cross-sectional views through a portion of the connector shown in FIG. 5;

FIG. 8 is a section along line 8—8 of FIG. 6; and

Figure 9:
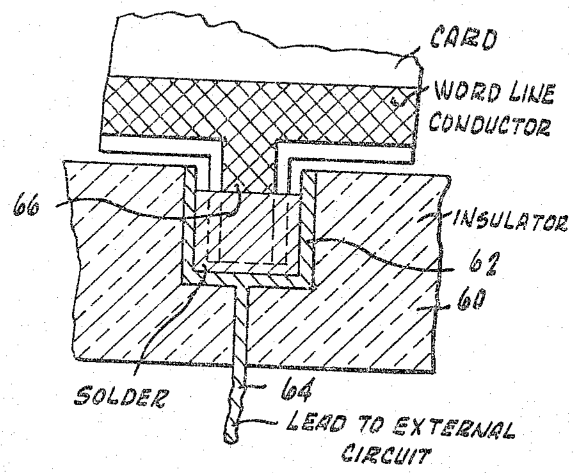

FIG. 9 is a cross-sectional view of another connector and a portion of a stack of cards.

Figure 1:
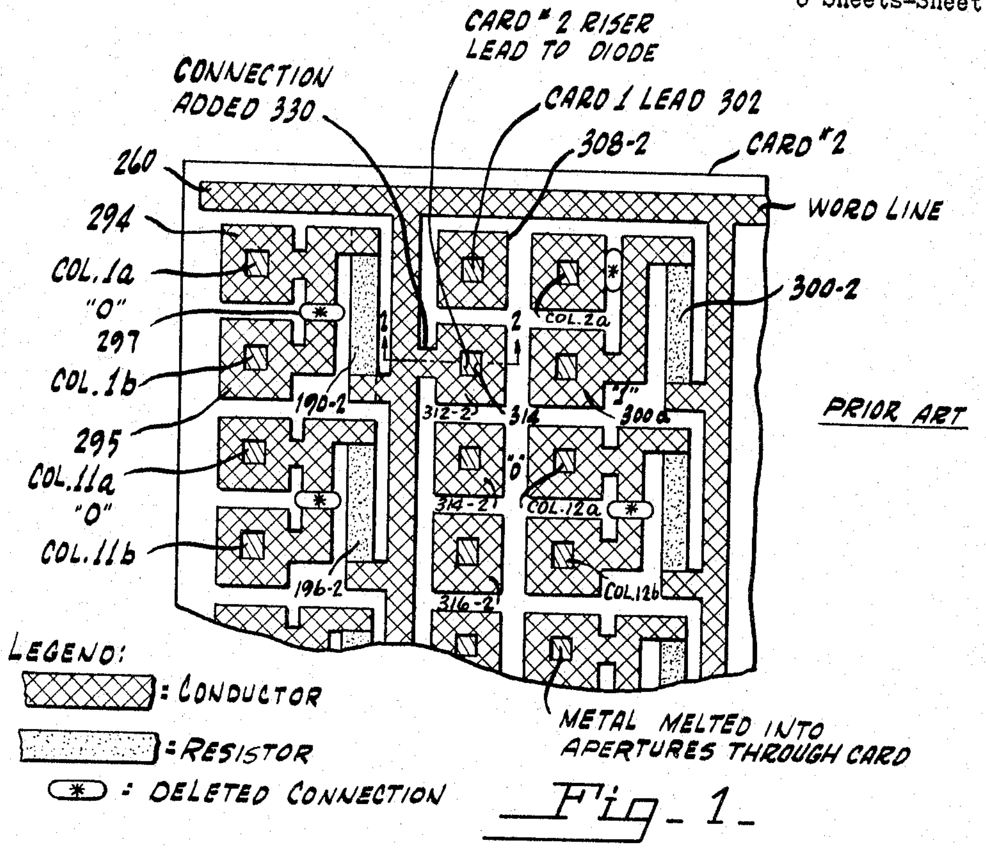
FIG. 1 is a plan view of a portion of a prior-art memory card.

The card shown in FIG. 1 is described in detail in copending application Ser. No. 294,288, filed July 11, 1963 by H. R. Beelitz and assigned to the same assignee as the present invention. In brief, the card of FIG. 1, only a portion of which is shown in the figure, is a memory circuit which is capable of storing binary bits. The storage elements are resistors such as shown at 190–2, 196–2, 300–2, and so on. These resistors are all connected at one end to a common word line 260. Each resistor is initially connected at its other end to two terminals as, for example, 294 and 295.

Information is written into a card by punching holes in the card as is indicated by the asterisks. A hole disconnects one of the two terminals from the resistor. For example, the hole 297 disconnects terminal 295 from resistor 190–2. This resistor is therefore connected only to terminal 294 and, so connected, represents storage of the binary digit (bit) zero. The resistor 300–2, on the other hand, is connected to terminal **300*a*** and represents storage of the bit one.

The various terminals on the cards are connected to external circuits by means of riser columns such as columns **1*a*, 1*b***, and so on. The riser columns are preferably made of low-melteing-point metal alloy, such as a low-melting-point solder, which is poured into the aligned apertures in the cards.

It is also desired to connect the common word line 260 on the various cards to circuits external of the cards. For example, in the circuits of FIGS. 8 and 9 of the copending application, the respective common word lines are connected, each through a diode (diodes 190, 192 and 194 of the figures), to a common lead to an interrogation circuit. This connection is made, in each case, by terminals, and riser columns which connect to the terminals.

The terminals for the word line appear in FIG. 1 at 308–2, 313–2, 314–2, 316–2, and so on. Initially, these terminals are all disconnected from the word line 260. To connect a particular word line to a particular riser lead for the word line, a connection is printed, painted or otherwise formed between the word line and the terminal. The word line 260 on the card shown is connected to terminal 312–2 by means of added connection 330.

Figure 2:
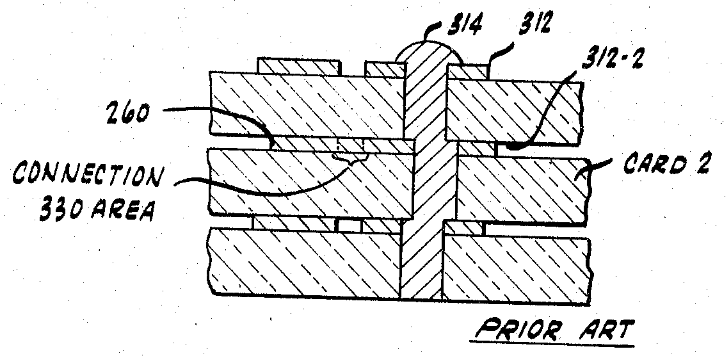
FIG. 2 is a section taken along line 2—2 of FIG. 1.

A cross-section through the card of FIG. 1 at the terminal 312–2 is shown in FIG. 2. The riser lead 314 connects to the terminal 312–2 which in turn is connected via the conductor area 330 to the common word line 260. The riser lead 314 also connects to corresponding terminals on the cards above and below card 2. However, these terminals, such as 312, are not connected to the common word lines 260 on their respective cards so that the riser 314 does not make connection to the common word lines 260 on the other cards.

As may be seen in FIG. 2, it is advantageous to stagger the terminals on the cards with respect to one another in order to achieve larger area contact between the riser lead and the terminal. The copending application discusses a number of different ways this may be accomplished.

The method of connection to the word lines discussed above is advantageous in that all of the cards can be identical, as supplied by the factory. However, the method does have its disadvantages. One is that the terminals for the riser leads for the word lines take up a substantial amount of the space on the card. For example, if it is desired to employ a stack of say 100 cards, which have continuous riser columns through the stack, then room must be provided on each card for 100 terminals such as 308–2, 312–2, 314–2, and so on. The greater the number of cards it is desired to have in a stack, the more area on each card which must be set aside for word line terminals and the less area available for memory elements. Thus, as a practical matter, the number of cards it is possible to have in a stack is limited.

Another disadvantage of the word line connection method above is that the diodes in the external circuits are located at the ends of the riser columns, a relatively long distance (perhaps 4–12 inches or more) from the memory elements on the cards. This introduces problems of distributed reactances due to the relatively long lead lengths and this in turn limits the operating speed of the memory.

The connection method of the present invention, as shown in FIGS. 3*a*–3*c*, has neither of the above disadvantages. The word line conductor is shown at 10 in FIG. 3*a*. It is connected in common to all of the memory elements on the card. Three such elements are shown at 12, 14 and 16 in FIG. 3*a*, however, for the sake of drawing simplicity, the memory elements are omitted from FIGS. 3*b* and 3*c*. The connection of the resistor storage elements to the terminals is the same as that discussed in the copending application above and therefore need not be discussed here. Connection to the word line is achieved via a tab **18*a*. An extension 20 of the word line conductor 10 is located on the tab 18** and acts as a connection terminal for the word line.

In the connection arrangement of the present invention, a number of different types of cards are employed, each with a tab in a different location. For the sake of the present illustration, it is assumed that five different types of cards are employed. The type 1 card is shown in FIG. 3*a*. The type 2 card, as shown in FIG. 3*b*, has a tab 18*b* which is displaced slightly to the right, as viewed in the figure, from the tab 18*a* of FIG. 3*a*. The types 3 and 4 cards are not shown, but their tabs are staggered with respect to one another and with respect to tabs 18*a* and 18*b*. The type 5 card is shown in FIG. 3*c* and, as clear from the figure, its tab 18*e* is also staggered with respect to the remaining tabs.

A portion of a stack of cards is shown in FIG. 4. The apertures on adjacent cards are preferably slightly displaced from one another, in the manner shown in FIG. 2, to insure more positive contact to the memory element terminals (not shown) on the cards. The first five cards are arranged in order from 1 to 5. The next five cards are arranged in the same order, and so on. Due to the fact that the terminals on adjacent cards are staggered, they do not interfere with one another. Connection to the tabs is achieved by placing a multiple-socket connector, such as shown in FIG. 5, over the tabs as is discussed in more detail in connection with FIGS. 6 and 7. The sockets 40 may be of rectangular cross-section, as shown, or may be of circular or other cross-section. These sockets are sufficiently large in cross-section so that the tabs loosely fit into the sockets.

Only a portion of the card is shown in FIG. 6. The word-line conductor is shown at 10, the tab at 18 and the extension of the word-line conductor (the terminal) on the tab at 20. The connector includes a diode 30 which is embedded in an insulator 32. A copper backing plate 34, which serves as the common connector for all of the diodes, is secured to one surface of the insulator 32. One electrode 36 of the diode passes through an aperture in the copper plate. The other electrode 38 of the diode passes into the opening or socket 40 which is adapted to receive the tab 18.

A preformed, low-melting-point, solder pellet 42 is located in the socket 40. This pellet has an opening 44 which mates with the projecting portion of electrode 38 and a slot-shaped second opening 46 (FIG. 8) which mates with the tab 18. The pellet is shown somewhat more clearly in the cross-sectional view of FIG. 8.

The preformed solder pellet 42 may be (but need not necessarily be) made of a metal alloy which has a lower melting point than the metal used for the riser columns. This is to lessen the tendency of the riser columns to melt during the melting of the pellet 42.

In the manufacture of the memory according to the present connection method, first the stack of cards is formed and the riser columns for the memory elements inserted as described in the copending application above. Then the stack of cards is placed over the multiple-socket connector as shown in FIG. 6. The diodes are already in place in the connector, having been soldered to the copper plate previously, as shown at 48 in FIG. 6. Preferably, a dip-soldering technique is employed so that all of the diodes are soldered to the copper plate at the same time. Thereafter, the connector and cards may be heated as, for example, by placing them in an oven. The temperature employed is greater than that required to melt the solder pellets 42, but less than that which is needed to melt the riser columns. Alternatively, the solder pellet may be melted by dielectric heating or, if desired by a heating element, shown schematically at 49 in FIGURE 6, embedded in the insulator 32 adjacent to the sockets 40. When the pellet melts, it makes good electrical contact both to the terminal 38 of the diode and the conductor 20, as shown in FIG. 7. Thereafter, heat is removed and the solder solidifies making a solid connection with good electrical properties between the connector and the memory stack.

In the present arrangement, each diode is positioned immediately adjacent to its card. An advantage of this type of connection is that it permits the lead lengths to be short and consequently permits the use of higher operating frequencies. A second advantage is that, in addition, very little room is used on the card for the terminals. In the example given, regardless of the number of cards in the stack, there are only five terminal areas required for connection to the word lines. Regardless of the number of cards in the stack, the part of each card available for memory locations remains the same, and is the major part of the card. Thus, the number of cards in the stack can be increased very substantially over that of the prior art arrangement discussed above.

A third advantage of the present arrangement is that the connection between the word line conductor and the terminal (tab) is made (printed, screened or the like) at the same time as the remainder of the circuits on the card are printed. It is not necessary to paint conductors, such as 330, FIG. 1, on the cards to connect the word line conductors to the external circuits. The painting of individual lines is time consuming and therefore costly.

In the method of connection discussed above, a preformed solder pellet is employed to join the world-line terminal to the diode electrode. One may instead simply use a ball, a cube or other shape of solder pellet or pellets. Here the solder is first melted and, when the solder is in liquid form, the tabs are mated with the sockets. Then, the solder is permitted to cool. With this method of connection, the melting point of the solder need not be lower than that of the riser columns.

There is also a third method of connection which is advantageous in that the stack of cards can easily be removed from the terminal block. In this method, a liquid conductor, such as mercury, is employed. However, when mercury is used, the multi-socket terminal should be positioned horizontally so that the mercury does not spill out. Alternatively, a gasket having holes in positions corresponding to the socket openings may be placed between the stack of cards and the multiple socket connector and the connector secured against the gasket and stack to provide a tight seal.

In the preferred form of the invention described in connection with FIGS. 3*a*–3*c*, and 4–8, the multiple-socket connector includes diodes embedded in the connector. However, the invention is not limited to this specific form of connector. It is also possible to employ a multiple-socket connector which includes leads or pins extending from the connector for connection to a separate chassis which includes the diodes or other circuit elements. A schematic showing of such a connector appears in FIG. 9.

In the arrangement of FIG. 9, a block of insulating material 60 is formed with a plurality of sockets, only one of which is shown, arranged in positions corresponding to the positions of the tabs in a stack of cards. A conductive element 62 is located in each of the openings. A lead 64 is connected to the conductive element 62 and extends from the insulator.

The method of connecting the multiple-socket connector to a stack of cards is similar to that already discussed. A pellet (or pellets) is placed in each opening in the multiple socket connector. The connector is then heated to melt the solder. This may be done by any of the methods previously discussed. Then the stack of cards is positioned so that the tabs mate with the sockets. Then the solder is permitted to cool, whereby a strong connection with good electrical characteristics is made between the metal terminal 66 on the card and the metal portion 62 of the socket.

In the claims which follow, the term "socket" is employed in a generic sense to describe an opening in an insulator which has a metal liner such as the one shown in FIG. 9 or which has a metal piece extending into the opening such as shown in FIGS. 6 and 7. The term "printed" circuit or conductor is also employed in its generic sense in the claims to describe a circuit or conductor on the surface of the card laid down by printing, silk screening, vacuum deposition, spraying or other means.

What is claimed is:

1. A method of making a connection between an element having a terminal and a conductor printed on a surface of a card comprising the steps of:

forming the card with a projecting tab which includes, on one surface thereof, a portion of said printed conductor;

embedding the element in an insulator formed with a socket into which said terminal projects;

placing a pellet of low melting point conductor into the socket, the pellet being formed with a first aperture which mates with said terminal, and a second aperture which is adapted to receive the tab;

arranging the card so that its tab is in the second aperture of the pellet located in the socket; and melting the pellet and then permitting it to solidify.

2. A method of making connection between printed circuits on the surface of a plurality of cards and a corresponding plurality of circuit elements not on the cards, comprising the steps of:

forming each card with a projecting tab which includes, on one surface thereof, a terminal which connects to the printed circuit on the card and which terminals are in one of a number of different positions on the respective cards;

stacking the cards one next to the other with one surface of each card abutting a surface of a next adjacent card and with the tabs on adjacent cards in staggered relationship;

placing said plurality of circuit elements in a multiple socket connector shaped to mate with the tabs projecting from the stack of cards with one terminal of each circuit element projecting into one of the sockets;

placing into each socket a pellet of low melting point conductor, the pellet being formed with a first aperture which is mateable with a tab on the card and a second aperture which mates with the terminal projecting into the socket of the circuit element;

mating the tabs with the sockets so that each tab is positioned in an aperture of a pellet; and melting the solder pellet and then permitting it to solidify.

References Cited by the Examiner

UNITED STATES PATENTS

| | | | |
|---|---|---|---|
| 1,792,973 | 2/1931 | Frenz | 339—118 |
| 2,707,272 | 4/1955 | Blitz | 339—275 X |
| 2,845,516 | 7/1958 | Jones | 339—275 X |
| 2,935,722 | 5/1960 | Kacin | 339—118 |
| 3,004,230 | 8/1961 | Levinson | 317—101 |
| 3,070,650 | 12/1962 | Stearns | 174—88 |
| 3,072,874 | 1/1963 | Roney | 339—17 |
| 3,087,096 | 4/1963 | Jorgensen | 317—101 |
| 3,184,830 | 5/1965 | Lane et al. | 174—68.5 X |
| 3,250,848 | 5/1966 | Beelitz et al. | 174—68 |

FOREIGN PATENTS

| | | |
|---|---|---|
| 1,143,246 | 4/1957 | France. |
| 803,958 | 11/1958 | Great Britain. |

OTHER REFERENCES

Sylvania "Electronic Design," June 22, 1960, p. 28.

LEWIS H. MYERS, *Primary Examiner.*

A. S. TRASK, D. L. CLAY, *Assistant Examiners.*